United States Patent
Iwasaki et al.

(10) Patent No.: US 10,683,636 B2
(45) Date of Patent: Jun. 16, 2020

(54) CONSTRUCTION MACHINE AND PROGRAM-REWRITABLE SYSTEM EQUIPPED WITH SAME

(71) Applicant: KOBELCO CONSTRUCTION MACHINERY CO., LTD., Hiroshima-shi (JP)

(72) Inventors: Kazuhiro Iwasaki, Hiroshima (JP); Hideki Yoshihara, Hiroshima (JP); Yoichiro Yamazaki, Hiroshima (JP)

(73) Assignee: KOBELCO CONSTRUCTION MACHINERY CO., LTD., Hiroshima-shi (JP)

( * ) Notice: Subject to any disclaimer, the term of this patent is extended or adjusted under 35 U.S.C. 154(b) by 203 days.

(21) Appl. No.: 15/737,581

(22) PCT Filed: Jun. 16, 2016

(86) PCT No.: PCT/JP2016/067884
§ 371 (c)(1),
(2) Date: Dec. 18, 2017

(87) PCT Pub. No.: WO2017/002631
PCT Pub. Date: Jan. 5, 2017

(65) Prior Publication Data
US 2018/0155901 A1 Jun. 7, 2018

(30) Foreign Application Priority Data
Jun. 29, 2015 (JP) .................................. 2015-129762

(51) Int. Cl.
*G01R 31/36* (2020.01)
*E02F 9/20* (2006.01)
(Continued)

(52) U.S. Cl.
CPC ................ *E02F 9/20* (2013.01); *B60R 16/02* (2013.01); *B60R 16/04* (2013.01); *E02F 9/26* (2013.01);
(Continued)

(58) Field of Classification Search
CPC combination set(s) only.
See application file for complete search history.

(56) References Cited

U.S. PATENT DOCUMENTS

2004/0002793 A1* 1/2004 Tachibana ................. G06F 8/65
 701/1
2004/0162907 A1* 8/2004 Kouda .............. H04L 29/12009
 709/229
(Continued)

FOREIGN PATENT DOCUMENTS

| CN | 1940872 A | 4/2007 |
|---|---|---|
| CN | 103711171 A | 4/2014 |

(Continued)

OTHER PUBLICATIONS

Extended European Search Report dated Jun. 13, 2018 in Patent Application No. 16817740.0.
(Continued)

*Primary Examiner* — Redhwan K Mawari
(74) *Attorney, Agent, or Firm* — Oblon, McClelland, Maier & Neustadt, L.L.P.

(57) ABSTRACT

A construction machine that, prior to performing a rewriting process of rewriting a currently used program with a renewal program, detects a charge amount of an electric storage device. When the charge amount detected is smaller than a rewrite charge amount preliminarily set as a charge amount required for the rewriting process, the rewriting is prohibited and the renewal program is transferred to storage. When the
(Continued)

charge amount becomes sufficient, the rewriting process is performed using the renewal program stored in the storage.

4 Claims, 4 Drawing Sheets

(51) Int. Cl.
| | |
|---|---|
| G01R 31/382 | (2019.01) |
| G06F 11/00 | (2006.01) |
| B60R 16/02 | (2006.01) |
| B60R 16/04 | (2006.01) |
| G06F 9/445 | (2018.01) |
| E02F 9/26 | (2006.01) |
| G06F 8/65 | (2018.01) |

(52) U.S. Cl.
CPC .......... *E02F 9/268* (2013.01); *G01R 31/3647* (2019.01); *G01R 31/382* (2019.01); *G06F 8/65* (2013.01); *G06F 9/445* (2013.01); *G06F 11/00* (2013.01)

(56) References Cited

U.S. PATENT DOCUMENTS

| | | | | |
|---|---|---|---|---|
| 2007/0210743 | A1* | 9/2007 | Tabei | B60L 1/00 320/104 |
| 2010/0245341 | A1* | 9/2010 | Tanaka | G09G 3/344 345/214 |
| 2018/0155901 | A1* | 6/2018 | Iwasaki | B60R 16/02 |

FOREIGN PATENT DOCUMENTS

| | | |
|---|---|---|
| EP | 1 439 466 A2 | 7/2004 |
| EP | 1 832 464 A2 | 9/2007 |
| EP | 2 602 157 A1 | 6/2013 |
| EP | 2602157 * | 6/2013 |
| JP | 2004-192278 A | 7/2004 |
| JP | 2006-072761 * | 3/2006 |
| JP | 2009-110529 A | 5/2009 |
| JP | 4487007 B2 | 6/2010 |
| JP | 2013-84143 A | 5/2013 |

OTHER PUBLICATIONS

International Search Report dated Sep. 6, 2016 in PCT/JP2016/067884 filed Jun. 16, 2016.

* cited by examiner

CONSTRUCTION MACHINE AND PROGRAM-REWRITABLE SYSTEM EQUIPPED WITH SAME

TECHNICAL FIELD

The present invention relates to a technique for rewriting a program in a construction machine such as excavator, the program being used to perform various controls during a work, collection of vehicle information such as accumulated operation time, transfer of data to and from an outside entity, and other controls.

BACKGROUND ART

For example, a rewrite control system for an on-board program disclosed in Patent Literature 1 includes a rewrite-dedicated server and a construction machine communicable with the rewrite-dedicated server.

The rewrite-dedicated server receives vehicle-state data from the construction machine, and determines whether a condition allowing rewrite of a program (hereinafter, referred to as "rewrite condition") is satisfied based on the receipt vehicle-state data. When determining that the rewrite condition is satisfied, the server transmits a renewal program to the construction machine.

On the other hand, the construction machine includes a flash memory for storing a currently used program, a RAM for storing the renewal program transmitted from the server, and an information collection controller for rewriting the currently used program in the flash memory with the renewal program. Upon receipt of the renewal program from the server, the information collection controller rewrites the currently used program with the renewal program.

The rewrite condition includes that a key switch is off, i.e. an engine is stopped.

In the rewrite control system for an on-board program disclosed in Patent Literature 1, the rewriting process using the renewal program is performed when the engine is stopped, and therefore, there is a possibility that the rewriting process could not be normally terminated.

Specifically, the construction machine includes the engine, a generator connected to the engine, and an electric storage device for storing an electric power generated by the generator. The rewriting process is considered to be performed using the electric power stored in the electric storage device.

However, when an electric power required for the rewriting process is not stored in the electric storage device, the rewriting process is terminated in the middle.

In this case, not only the rewriting process is abnormally terminated, but also there is a possibility that the currently used program may be broken, so that the construction machine cannot be started.

CITATION LIST

Patent Literature

Patent Document 1: Japanese Patent No. 4487007

SUMMARY OF INVENTION

The present invention has an object of providing a construction machine and a program-rewritable system including the same capable of preventing abnormal termination of a program rewriting process performed when an engine is stopped.

In order to achieve this object, the present invention provides a construction machine, comprising: an engine; a generator for generating an electric power by a power of the engine; an electric storage device for storing the electric power generated by the generator; a controller for storing a currently used program, and performing a rewriting process of rewriting the currently used program with a renewal program using an electric power from the electric storage device when the engine is stopped; and a charge amount detector for detecting a charge amount of the electric storage device, wherein the controller checks, before performing the rewriting process, whether the charge amount detected by the charge amount detector is smaller than a rewrite charge amount preliminarily set as a charge amount required for the rewriting process, and when the charge amount detected by the charge amount detector is smaller than the rewrite charge amount, prohibits execution of the rewriting process.

Further, the present invention provides a program-rewritable system, comprising: a server for containing a renewal program; and the above-described construction machine, wherein the construction machine includes a vehicle controller for storing the currently used program, and a communication controller communicable with the server via a communication means to store the renewal program transferred from the server, and the vehicle controller includes a transfer request section for requesting the communication controller to transfer the renewal program, and a rewrite section for performing the rewriting process using the renewal program transferred from the communication controller.

According to the present invention, it is possible to prevent abnormal termination of a program rewriting process performed when an engine is stopped.

DESCRIPTION OF EMBODIMENTS

Hereinafter, embodiments of the present invention will be described with reference to the accompanying drawings. It should be noted that the following embodiments illustrate some examples of the invention, and do not delimit the protection scope of the invention.

Figure 1:
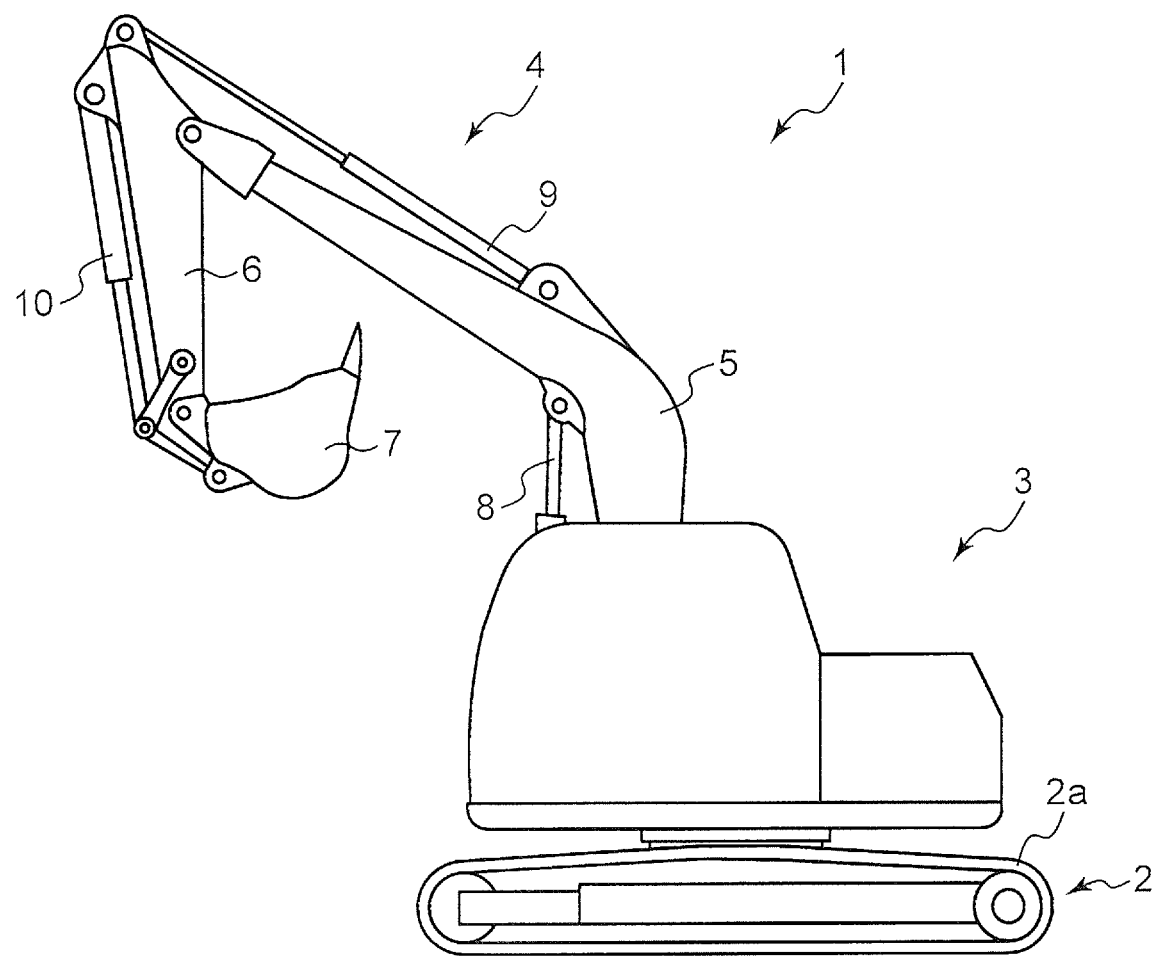
FIG. 1 is a side view showing an overall configuration of a hydraulic excavator according to a first embodiment of the present invention.
Figure 2:
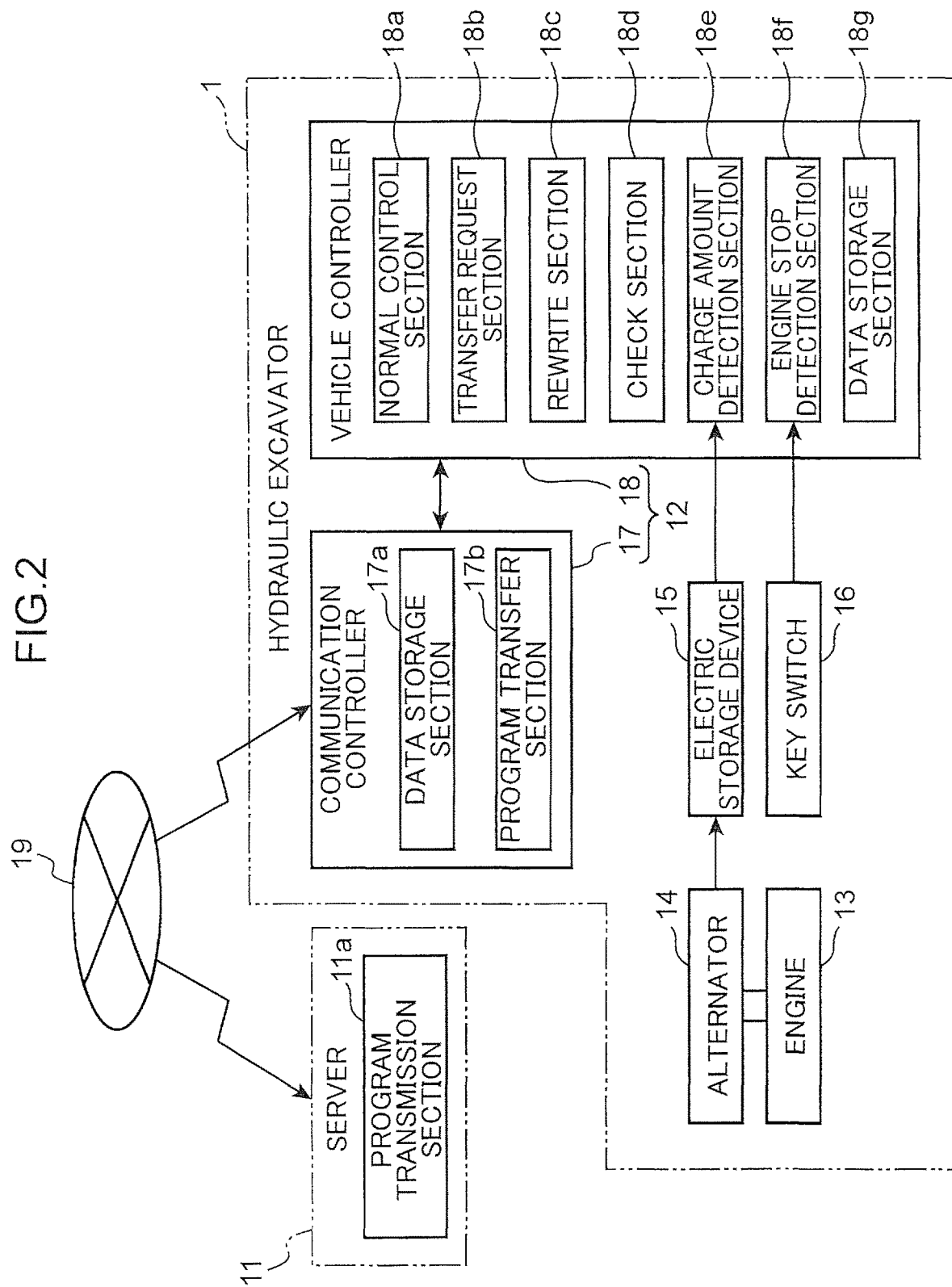
FIG. 2 is a block diagram showing an electrical configuration of a program-rewritable system including the hydraulic excavator shown in FIG. 1.
Figure 3:
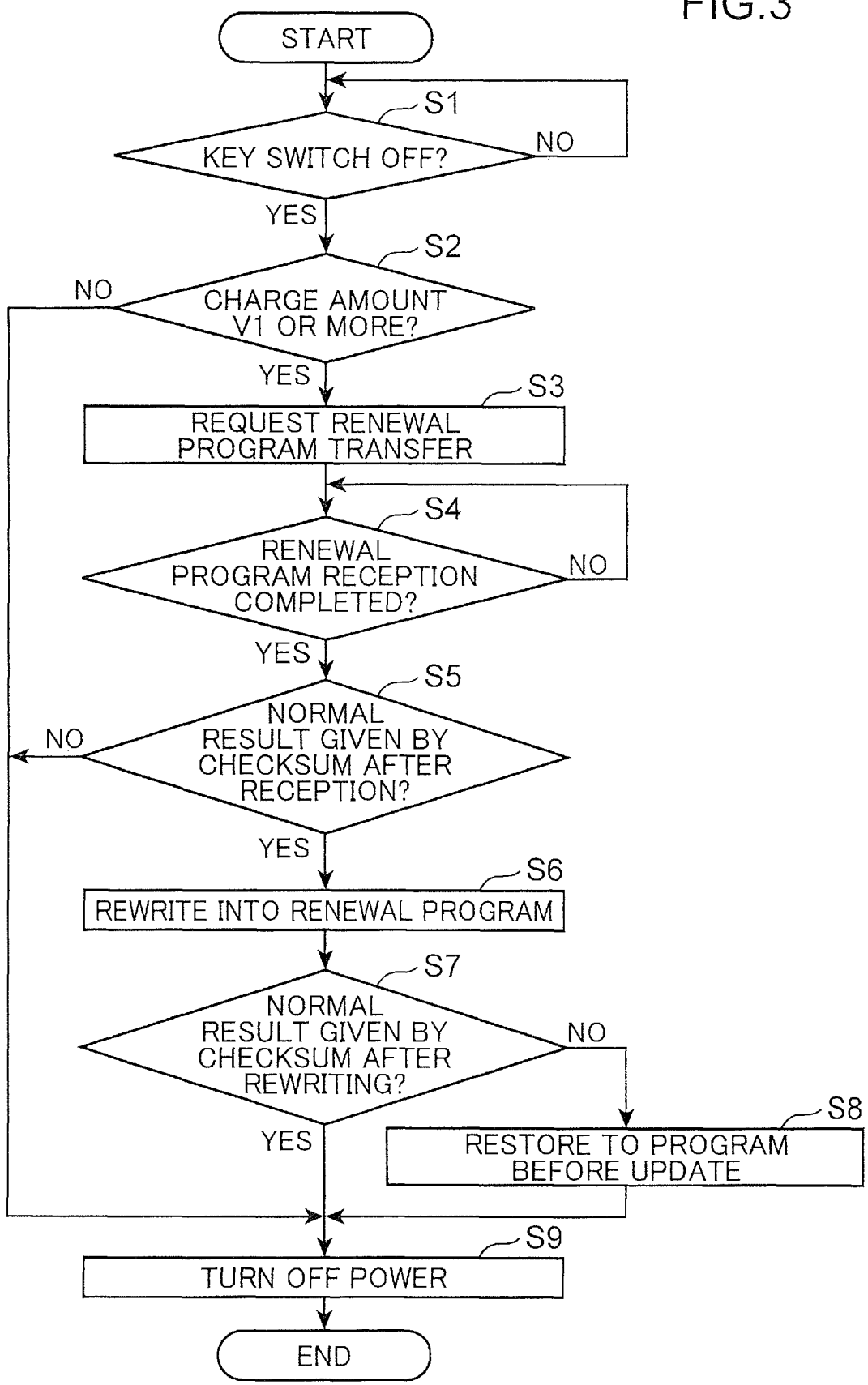
FIG. 3 is a flowchart showing an operation performed by a controller shown in FIG. 2.

First Embodiment (FIGS. 1 to 3)

With reference to FIG. 1, a hydraulic excavator 1, which exemplifies a construction machine according to a first embodiment of the present invention, includes a lower travelling body 2 having crawlers 2a, an upper slewing body 3 slewably mounted on the lower travelling body 2, and an attachment 4 attached to the upper slewing body 3.

The attachment 4 includes a boom 5 having a proximal end pivotally attached to the upper slewing body 3, an arm 6 having a proximal end pivotally attached to a distal end of the boom 5, and a bucket 7 pivotally attached to a distal end of the arm 6.

Further, the attachment 4 includes a boom cylinder 8 for pivotally driving the boom 5 with respect to the upper slewing body 3, an arm cylinder 9 for pivotally driving the arm 6 with respect to the boom 5, and a bucket cylinder 10 for pivotally driving the bucket 7 with respect to the arm 6.

FIG. 2 is a block diagram showing an electrical configuration of a program-rewritable system including the hydraulic excavator 1.

With reference to FIG. 2, the program-rewritable system includes the hydraulic excavator 1, and a server 11 communicable with the hydraulic excavator 1 via a communication means (for example, a mobile phone communication network) 19.

The server 11 contains a renewal program for rewriting a program described later stored in the hydraulic excavator 1. Further, the server 11 includes a program transmission section 11a for transferring the renewal program to the hydraulic excavator 1 via the communication means 19.

On the other hand, the hydraulic excavator 1 includes an engine 13, an alternator (generator) 14 for generating an electric power by a power of the engine 13, an electric storage device 15 for storing the electric power generated by the alternator 14, and a key switch 16 for outputting a command to switch the engine 13 between an activated state and a stopped state.

Further, the hydraulic excavator 1 includes a controller 12 that stores a currently used program and performs a rewriting process of rewriting the currently used program with the renewal program using an electric power from the electric storage device 15 when the engine is stopped.

Here, the program is used to perform various controls during a work, collection of vehicle information such as accumulated operation time, transfer of data to and from an outside entity, and other controls in the hydraulic excavator 1, in cooperation with hardware including CPU, RAM, and ROM.

Specifically, the controller 12 includes a communication controller 17 communicable with the server 11 via the communication means 19, and a vehicle controller 18 for performing transfer of data to and from the communication controller 17 through a CAN (Controller Area Network) communication.

The communication controller 17 includes a data storage section 17a for storing the renewal program transferred from the server 11, and a program transfer section 17b for transferring the renewal program stored in the data storage section 17a to the vehicle controller 18 in response to a request from the vehicle controller 18.

The vehicle controller 18 includes a normal control section 18a, a transfer request section 18b, a rewrite section 18c, a check section 18d, a charge amount detection section (charge amount detector) 18e, an engine stop detection section 18f, and a data storage section (storage section) 18g.

The normal control section 18a performs a normal control (for example, a control of a hydraulic pump for supplying hydraulic fluid to the actuators [such as the cylinders 8 to 10 of the attachment 4]) of the hydraulic excavator 1.

The transfer request section 18b requests the communication controller 17 to transfer the renewal program. In response to the request, the program transfer section 17b of the communication controller 17 transfers the renewal program to the vehicle controller 18. The renewal program transferred from the communication controller 17 to the vehicle controller 18 is stored in the data storage section 18g.

The rewrite section 18c rewrites the currently used program using the renewal program transferred from the communication controller 17. After the renewal program is transferred from the communication controller 17 and before the currently used program is rewritten, the currently used program and the renewal program transferred from the communication controller 17 are stored in separate regions of the data storage section 18g. In addition, even after the program rewriting, the currently used program is stored in a temporary storage region of the data storage section 18g different from a region where the renewal program (a rewritten program) is stored. Therefore, when an error is detected in the rewritten program by the check section 18d described later after the program rewriting, the rewritten program can be restored to the state before the update, using the program stored in the temporary storage region. The currently used program stored in the temporary storage region is deleted when no error is detected in the rewritten program by the check section 18d.

The check section 18d performs a program check. Specifically, the check section 18d checks whether the renewal program transferred from the communication controller 17 to the vehicle controller 18 and stored in the data storage section 18g includes no error. Further, the check section 18d checks whether the rewritten program stored in the data storage section 18g as mentioned above includes no error. The check section 18d performs, for example, a checksum in which preliminarily digitized data total value is verified.

The charge amount detection section 18e detects a charge amount of the electric storage device 15. Specifically, the charge amount detection section 18e detects a voltage of the electric storage device 15 to detect a charge amount of the electric storage device 15 based on the detected voltage and a characteristic preliminarily stored in the data storage section 18g and representing a relationship between voltage of the electric storage device 15 and charge amount of the electric storage device 15.

The engine stop detection section 18f detects whether the engine 13 is in the stopped state. Specifically, the engine stop detection section 18f detects whether the engine 13 is stopped (whether the key switch 16 is turned off) based on an output signal of the key switch 16.

The data storage section 18g stores the currently used program and the program transferred from the communication controller 17.

The thus configured vehicle controller 18 checks, before performing the rewriting process, whether the charge amount detected by the charge amount detection section 18e is smaller than a rewrite charge amount preliminarily set as a charge amount required to perform the rewriting process by the rewrite section 18c, and when the charge amount detected by the charge amount detection section 18e is smaller than the rewrite charge amount, prohibits execution of the rewriting process.

Specifically, the rewrite charge amount is set to be equal to or greater than a sum of a charge amount required to transfer the renewal program from the communication controller 17 to the vehicle controller 18 and a charge amount required to rewrite the currently used program by the rewrite section 18c. When the charge amount detected by the charge amount detection section 18e is smaller than the rewrite charge amount, the vehicle controller 18 prohibits the transfer request section 18b from requesting the transfer.

Consequently, it is possible to prevent abnormal termination of the program rewriting process due to lack of charge amount of the electric storage device 15 in advance.

Hereinafter, an operation performed by the controller 12 (vehicle controller 18) will be described with reference to FIG. 3, assuming that the communication controller 17 has already received the renewal program from the server 11.

Upon start of the operation, it is first determined whether the key switch 16 is turned off, i.e. whether the engine 13 is stopped (step S1).

When it is determined that the key switch 16 is off (YES at step S1), step S2 and the subsequent steps are performed.

At step S2, it is determined whether a charge amount of the electric storage device 15 detected by the charge amount detection section 18e is equal to or greater than the rewrite charge amount V1.

When it is determined that the charge amount of the electric storage 15 is equal to or greater than the rewrite charge amount V1 (YES at step S2), transfer of the renewal program is requested to the communication controller 17, through the transfer request section 18b (step S3). Consequently, the communication controller 17 starts transferring the renewal program to the vehicle controller 18.

Thereafter, it is determined whether the reception of the renewal program from the communication controller 17 has been completed (step S4), and when it is determined that the reception of the renewal program has not been completed (NO at step S4), the reception of the renewal program is continued.

On the other hand, when it is determined that the reception of the renewal program has been completed (YES at step S4), it is determined whether the receipt renewal program stored in the data storage section 18g includes no error (step S5).

When it is determined that the receipt renewal program includes an error (NO at step S5), the power of the hydraulic excavator 1 is turned off (step S9) to thereby terminate the operation. In addition, when it is determined NO at step S5, the renewal program stored in the data storage section 18g is deleted from the data storage section 18g. On the other hand, the renewal program is kept stored in the communication controller 17 until it is determined YES at step S5. Therefore, even when it is determined NO at step S5, the renewal program is kept stored in the communication controller 17 to be transferred to the vehicle controller 18 again when the control shown in FIG. 3 is performed again.

On the other hand, when it is determined that the receipt renewal program includes no error (YES at step S5), the program rewriting is performed using the renewal program (step S6).

Thereafter, it is determined whether the rewritten program includes no error (step S7).

When it is determined that the rewritten program includes an error (NO at step S7), the program is restored to the state before the update (before the rewriting) (step S8). In the data storage section 18g, the program before the update (the program used until the update) is kept stored until it is determined YES at step S7. Therefore, at step S8, the rewritten program in the data storage section 18g can be rewritten with the program before the rewriting.

On the other hand, when it is determined that the rewritten program includes no error (YES at step S7), the power of the hydraulic excavator 1 is turned off (step S9) to thereby terminate the operation.

As described above, the program transfer process and the program rewriting process are performed through the operation including steps S3 to S7.

On the other hand, when it is determined that the charge amount of the electric storage device 15 is smaller than the rewrite charge amount V1 at step S2 (NO at step S2), the above-mentioned rewriting process is prohibited, and the power of the hydraulic excavator 1 is turned off (step S9) to thereby terminate the operation.

As described above, the program rewriting process (steps S6 and S7) is prohibited when the charge amount of the electric storage device 15 is smaller than the rewrite charge amount V1. Therefore, it is possible to prevent abnormal termination of the program rewriting process performed when the engine 13 is stopped, due to lack of charge amount.

According to the first embodiment, the following advantageous effects can be provided.

The communication controller 17 that stores the renewal program transferred from the server 11 is provided separately from the vehicle controller 18 that stores the currently used program.

Consequently, it is possible to receive the renewal program from the server 11 and store it in the communication controller 17 while maintaining the use of the currently used program. This makes it possible to transfer a new program from the server 11 to the communication controller 17 while continuing work of the hydraulic excavator 1.

Further, the renewal program is transferred from the communication controller 17 to the vehicle controller 18 in response to the transfer request from the transfer request section 18b, which makes it possible to allow the rewrite section 18c to perform the rewriting process using the transferred renewal program.

It is possible, while shortening the operation time by successively performing the renewal program transfer process (steps S3 to S5) and the program rewriting process (steps S6 and S7), to prevent abnormal termination of the program rewriting process due to lack of charge amount by prohibiting the transfer of the renewal program when the charge amount of the electric storage device 15 is smaller than the charge amount (rewrite charge amount V1) required for the transfer process and the rewriting process.

Figure 4:
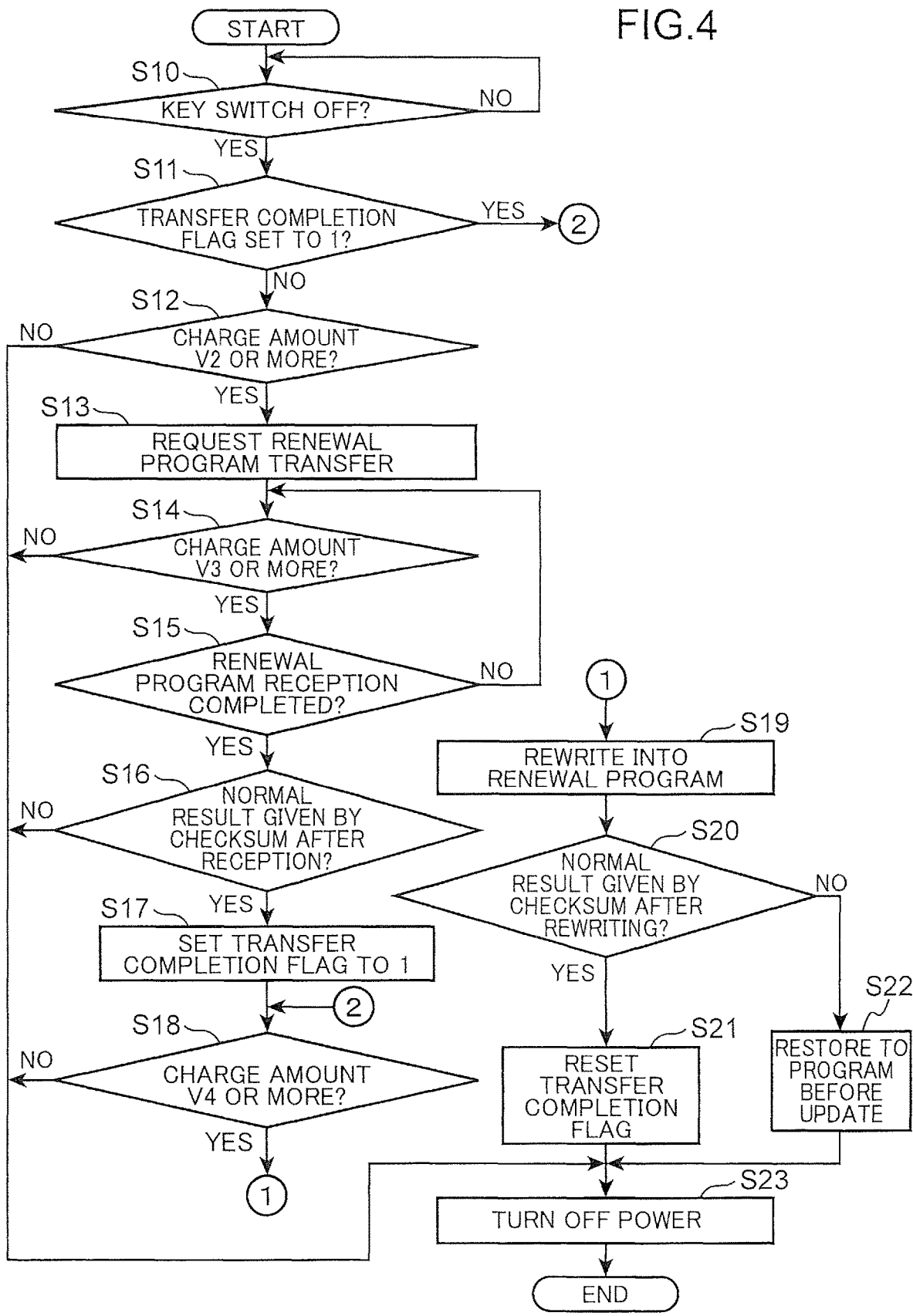
FIG. 4 is a flowchart showing an operation performed by a controller in a hydraulic excavator according to a second embodiment of the present invention.

Second Embodiment (FIG. 4)

In the first embodiment, the transfer process and the rewriting process are prohibited when the charge amount of the electric storage device 15 is smaller than the rewrite charge amount V1 obtained by adding the charge amount required to transfer the renewal program from the communication controller 17 to the vehicle controller 18 and the charge amount required for the program rewriting.

However, it may be configured such that the transfer process is permitted when the charge amount of the electric storage device 15 is smaller than the charge amount required to perform the transfer process and the rewriting process but is equal to or greater than the charge amount required for the transfer process, as shown in a second embodiment below.

Hereinafter, an operation performed by a controller (vehicle controller 18) according to the second embodiment will be described with reference to FIG. 4. Repeated descriptions of common features to the first embodiment will be partially omitted.

Upon start of the operation, it is first determined whether a key switch 16 is turned off, i.e. whether an engine 13 is stopped (step S10).

When it is determined that the key switch 16 is off (YES at step S10), step S11 and the subsequent steps are performed.

At step S11, it is determined whether a transfer completion flag is set to 1, the transfer completion flag indicating that transfer of a renewal program from a communication controller 17 to the vehicle controller 18 has already been completed (step S11).

When it is determined that the transfer completion flag is not set to 1, i.e. the transfer from the communication controller 17 to the vehicle controller 18 has not been completed (the transfer has not started) (NO at step S11), it is determined whether a charge amount of an electric storage device 15 detected by a charge amount detection section 18e is equal to or greater than a transfer charge amount V2 (step S12).

The transfer charge amount V2 is preliminarily set as a charge amount required to transfer the renewal program from the communication controller 17 to the vehicle controller 18.

When it is determined that the charge amount of the electric storage device 15 is equal to or greater than the transfer charge amount V2 at step S12 (YES at step S12), a transfer request section 18b is permitted to request the transfer (step S13). Consequently, the communication controller 17 starts transferring the renewal program to the vehicle controller 18.

Thereafter, during the transfer of the renewal program from the communication controller 17 to the vehicle controller 18, it is determined whether a charge amount of the electric storage device 15 detected by the charge amount detection section 18e is equal to or greater than a non-transferred charge amount V3 (step S14).

Here, the non-transferred charge amount V3 is specified based on a preliminarily stored characteristic indicating a relationship between data amount of a non-transferred portion of the renewal program and a charge amount of the electric storage device 15 required to transfer the non-transferred portion, and data amount of a current non-transferred portion of the renewal program. Thus, when the charge amount detected by the charge amount detection section 18e is equal to or greater than the non-transferred charge amount V3, the non-transferred portion of the renewal program can be completely transferred.

When it is determined that the charge amount of the electric storage device 15 is equal to or greater than the non-transferred charge amount V3 at step S14, it is determined whether the reception of the renewal program has been completed (step S15), and when it is determined that the reception of the renewal program has not been completed (NO at step S15), step S14 is repeated.

On the other hand, when it is determined at step S15 that the reception of the renewal program has been completed (YES at step S15), it is determined whether the receipt renewal program stored in a data storage section 18g includes no error (step S16).

When it is determined that the receipt renewal program includes no error (YES at step S16), the transfer completion flag indicating completion of the renewal program transfer process (steps S13 to S16) is set to 1 (step S17).

On the other hand, when the charge amount of the electric storage device 15 is smaller than the transfer charge amount V2 (NO at step S12), when the charge amount of the electric storage device 15 is smaller than the non-transferred charge amount V3 (NO at step S14), or when it is determined that the receipt renewal program includes an error (NO at step S16), the power of the hydraulic excavator 1 is turned off (step S23) to thereby terminate the operation. Thus, in these cases, the operation of the controller 12 ends without completion of the transfer process.

When the transfer process is completed, then it is determined before execution of a rewriting process whether a charge amount of the electric storage device 15 is equal to or greater than a rewrite charge amount V4 (step S18).

The rewrite charge amount V4 is set to be equal to or greater than a charge amount required to rewrite a program by a rewrite section 18c.

When it is determined that the charge amount of the electric storage device 15 is equal to or greater than the rewrite charge amount V4 (YES at step S18), the program is rewritten using the renewal program (step S19).

Thereafter, it is determined whether a rewritten program stored in the data storage section 18g includes no error (step S20).

When it is determined that the rewritten program includes an error (NO at step S20), the program is restored to the state before the update (before the rewriting) (step S22).

On the other hand, when it is determined that the rewritten program includes no error (YES at step S20), the transfer completion flag is set to 0 (reset) (step S21).

Subsequently to step S21 or step S22, the power of the hydraulic excavator 1 is turned off (step S23) to thereby terminate the operation.

As described above, the program rewriting process is performed through steps S19 to S21.

On the other hand, when it is determined at step 18 that the charge amount of the electric storage device 15 is smaller than the rewrite charge amount V4 (NO at step S18), the above-mentioned rewriting process is prohibited, and the power of the hydraulic excavator 1 is turned off (step S23) to thereby terminate the operation.

It should be noted that in a case where the operation shown in FIG. 4 is started again after the operation is terminated due to a determination at step S18 that the charge amount of the electric storage device 15 is smaller than the rewrite charge amount V4, the transfer process (steps S13 to S16) can be skipped after a determination of YES at the above-mentioned step S11. Thereafter, when it is determined at step S18 that the charge amount of the electric storage device 15 is equal to or greater than the rewrite charge amount V4, the rewriting process (steps S19 to S21) is performed.

As described above, according to the second embodiment, when the charge amount of the electric storage device 15 is equal to or greater than the transfer charge amount V2 but smaller than the charge amount that enables execution of the rewriting process (steps S19 to S21) in addition to the transfer process (steps S13 to S16), it is possible to transfer the renewal program and store it in the data storage section 18g and, when the charge amount of the electric storage device 15 becomes sufficient thereafter (when a determination of YES is made at step S18 after a determination of YES is made at step S11), perform the rewriting process using the renewal program stored in the data storage section 18g.

Therefore, even when the charge amount of the electric storage device 15 is smaller than the charge amount that enables execution of the transfer process and the rewriting process, the operation can be proceeded through some steps, and therefore, it is possible to shorten the time for completing the rewriting process by reducing the number of steps to be performed when the rewriting process is performed thereafter.

Here, there is a case where the charge amount during the transfer of the renewal program (after step S13 and before a determination of YES is made at step S15) becomes smaller than a charge amount expected based on the transfer charge amount V2 checked before the transfer of the renewal program, due to deterioration of the electric storage device 15 or the like. In this case, the charge amount of the electric storage device 15 is wastefully consumed despite that the renewal program transfer process cannot be completed.

In view of this, it is possible to prevent, when the charge amount of the electric storage device 15 becomes insufficient (when a determination of NO is made at step S14) during the transfer of the renewal program, wasteful consumption of the charge amount of the electric storage device 15 by forcibly terminating the transfer.

Moreover, it is possible to prohibit the program rewriting when the charge amount of the electric storage device 15 is smaller than the rewrite charge amount V4 (when a determination of NO is made at step S18 after step S17) after the renewal program is transferred.

Therefore, it is possible to reliably prevent, when the charge amount of the electric storage device 15 is equal to or greater than the transfer charge amount V2 but smaller than the charge amount that enables execution of the rewriting process in addition to the transfer process, abnormal termination of the program rewriting process during the execution of the transfer process.

The present invention is not limited to the above-described embodiments and, for example, the following configurations may be adopted.

In the above-described embodiments, the charge amount detector is illustrated as the charge amount detection section 18e of the vehicle controller 18 that detects the voltage of the electric storage device 15, but the charge amount detector is not limited to the charge amount detection section 18e as long as being operable to detect a charge amount of the electric storage device 15. For example, a configuration may be adopted that includes, as the charge amount detector, a vehicle controller for storing an initial charge amount, and an electric current detector operable to detect a charge/discharge current of the electric storage device 15. According to such charge amount detector, it is possible to calculate the current charge amount of the electric storage device 15 by adding or subtracting the current detected by the electric current detector to or from the initial charge amount.

In the above-described embodiments, the controller 12 is illustrated as including the communication controller 17 for receiving the renewal program from the server 11 and the vehicle controller 18 for receiving the renewal program from the communication controller 17, but the controller 12 is not limited to this configuration. Specifically, the controller 12 may be configured to be provided with the renewal program by an operator. Further, the controller is only required to include a region for storing a currently-used program and be configured to prohibit execution of the rewriting process when the charge amount of the electric storage device 15 detected by the charge amount detection section 18e is smaller than the rewrite charge amount required for the program rewriting.

In the above-described embodiments, the means for detecting that the engine 13 is stopped is illustrated as the key switch 16, but the means is not limited to the key switch 16. For example, a rotational speed detector operable to detect an engine rotational speed and a voltage detector operable to detect an inter-terminal voltage of the alternator 14 may be adopted as the above-mentioned means.

The program (renewal program) may be one that realizes one or more functions by itself, or one that realizes one or more functions in cooperation with another program. In other words, the controller 12 (vehicle controller 18) may be configured to update either the entirety of a program (a plurality of programs) for realizing a specific function or only one of a plurality of programs for realizing a specific function.

The construction machine is not limited to an excavator, and may be provided as a demolition machine or a crane, and is not limited to the hydraulic type and may be of hybrid type or electrical type.

The above-described specific embodiments mainly include inventions configured as follows.

The present invention provides a construction machine, comprising: an engine; a generator for generating an electric power by a power of the engine; an electric storage device for storing the electric power generated by the generator; a controller for storing a currently used program, and performing a rewriting process of rewriting the currently used program with a renewal program using an electric power from the electric storage device when the engine is stopped; and a charge amount detector for detecting a charge amount of the electric storage device, wherein the controller checks, before performing the rewriting process, whether the charge amount detected by the charge amount detector is smaller than a rewrite charge amount preliminarily set as a charge amount required for the rewriting process, and when the charge amount detected by the charge amount detector is smaller than the rewrite charge amount, prohibits execution of the rewriting process.

According to the present invention, the program rewriting process is prohibited when the charge amount of the electric storage device is smaller than the rewrite charge amount. Therefore, it is possible to prevent abnormal termination of the program rewriting process performed when the engine is stopped, due to lack of charge amount.

Here, it is possible to perform the program rewriting process using a renewal program transferred from a server located separately from the construction machine.

In this case, the operation from the transfer of the renewal program to the rewriting can be successively performed, which, however, causes a problem of extending the time during which the use of the currently used program is limited and work of the construction machine has to be suspended from the start of the transfer of the renewal program to the end of the rewriting.

In view of this, in the above-described construction machine, it is preferred that the controller include a vehicle controller for storing the currently used program, and a communication controller communicable with a server containing the renewal program via a communication means to store the renewal program transferred from the server, and that the vehicle controller include a transfer request section for requesting the communication controller to transfer the renewal program, and a rewrite section for performing the rewriting process using the renewal program transferred from the communication controller.

Further, the present invention provides a program-rewritable system, comprising: a server for containing a renewal program; and the above-described construction machine, wherein the construction machine includes a vehicle controller for storing the currently used program, and a communication controller communicable with the server via a communication means to store the renewal program transferred from the server, and the vehicle controller includes a transfer request section for requesting the communication controller to transfer the renewal program, and a rewrite section for performing the rewriting process using the renewal program transferred from the communication controller.

According to these configurations, separately from the vehicle controller for storing the currently used program, the communication controller for storing the renewal program transferred from the server is provided.

Consequently, it is possible to receive the renewal program from the server and store it in the communication controller while maintaining the use of the currently used program. This makes it possible to transfer a new program from the server to the communication controller while continuing work of the construction machine.

Further, according to the above-described configurations, the renewal program is transferred from the communication controller to the vehicle controller in response to the transfer request from the transfer request section, which makes it possible to allow the rewrite section to perform the rewriting process using the transferred renewal program.

Here, it is possible to shorten the operation time by successively performing the transfer process of transferring the renewal program from the communication controller to the vehicle controller and the program rewriting process in the vehicle controller.

However, in this case, an electric power for performing the transfer process is required in addition to the electric power for performing only the rewriting process.

In view of this, in the above-described construction machine, it is preferred that the rewrite charge amount be set to be equal to or greater than a sum of a charge amount required to transfer the renewal program from the communication controller to the vehicle controller and a charge amount required to rewrite the currently used program by the rewrite section, and that the communication controller prohibit the transfer request section from requesting the transfer when the charge amount detected by the charge amount detector is smaller than the rewrite charge amount.

According to this configuration, it is possible, while shortening the operation time by successively performing the renewal program transfer process and the program rewriting process, to prevent abnormal termination of the program rewriting process due to lack of charge amount by prohibiting the transfer of the renewal program when the charge amount of the electric storage device is smaller than the charge amount required for the transfer process and the rewriting process.

On the other hand, in the above-described construction machine, it may also be configured such that the vehicle controller includes a storage section for storing the renewal program, and checks, before a start of transfer of the renewal program from the communication controller to the vehicle controller, whether the charge amount detected by the charge amount detector is equal to or greater than a transfer charge amount preliminarily set as a charge amount required to transfer the renewal program from the communication controller to the vehicle controller, and when the charge amount detected by the charge amount detector is equal to or greater than the transfer charge amount, permits the transfer request section to request the transfer and causes the storage section to store the transferred renewal program.

According to this configuration, when the charge amount of the electric storage device is equal to or greater than the transfer charge amount but smaller than the charge amount that enables execution of the rewriting process in addition to the transfer process, it is possible to transfer the renewal program and store it in the storage section and, when the charge amount of the electric storage device becomes sufficient thereafter, perform the rewriting process using the renewal program stored in the storage section.

Therefore, even when the charge amount of the electric storage device is smaller than the charge amount that enables execution of the transfer process and the rewriting process, the operation can be proceeded through some steps, and therefore, it is possible to shorten the time for completing the rewriting process by reducing the number of steps to be perform when the rewriting process is performed thereafter.

Here, there is a case where the charge amount of the electric storage device during the transfer of the renewal program becomes smaller than a charge amount expected based on the transfer charge amount checked before the transfer of the renewal program, due to deterioration of the electric storage device or the like. In this case, the charge amount of the electric storage device is wastefully consumed despite that the renewal program transfer process cannot be completed.

In view of this, in the above-described construction machine, it is preferred that the vehicle controller check, during the transfer of the renewal program from the communication controller to the vehicle controller, whether the charge amount detected by the charge amount detector is smaller than a non-transferred charge amount preliminarily set as a charge amount required to transfer a non-transferred portion of the renewal program, and when the charge amount detected by the charge amount detector is smaller than the non-transferred charge amount, compulsorily terminate the transfer of the renewal program.

According to this configuration, it is possible to prevent, when the charge amount of the electric storage device becomes insufficient during the transfer of the renewal program, wasteful consumption of the charge amount of the electric storage device by forcibly terminating the transfer.

In the above-described construction machine, it is preferred that the rewrite charge amount be set to be equal to or greater than a charge amount required to rewrite the currently used program by the rewrite section, and that the vehicle controller check, before performing the rewriting process after the renewal program is transferred from the communication controller to the vehicle controller, whether the charge amount detected by the charge amount detector is smaller than the rewrite charge amount, and when the charge amount detected by the charge amount detector is smaller than the rewrite charge amount, prohibit the rewrite section from rewriting the currently used program.

According to this configuration, it is possible to prohibit the program rewriting when the charge amount of the electric storage device is smaller than the rewrite charge amount after the renewal program is transferred.

Therefore, it is possible to reliably prevent, when the charge amount of the electric storage device is equal to or greater than the transfer charge amount but smaller than the charge amount that enables execution of the rewriting process in addition to the transfer process, abnormal termination of the program rewriting process during the execution of the transfer process.

The invention claimed is:

1. A construction machine, comprising:
an engine;
a generator for generating an electric power by a power of the engine;
an electric storage device connected to the generator and configured to store the electric power generated by the generator; and
circuitry including
a controller configured to store a currently used program, and performing a rewriting process of rewriting the currently used program with a renewal program using an electric power from the electric storage device when the engine is stopped; and a charge amount detector connected to the electric storage device and configured to detect a charge amount of the electric storage device, wherein the controller checks, before performing the rewriting process, whether the charge amount detected by the charge amount detector is smaller than a rewrite charge amount preliminarily set as a charge amount required for the rewriting process, and when the charge amount detected by the charge amount detector is smaller than the rewrite charge amount, prohibits execution of the rewriting process, the controller includes a vehicle controller for storing the currently used program, and a communication controller communicable with a server containing the renewal program via a communication means to store the renewal program transferred from the server;

the vehicle controller includes a transfer request section for requesting the communication controller to transfer the renewal program, and a rewrite section for performing the rewriting process using the renewal program transferred from the communication controller;

the vehicle controller includes a storage section for storing the renewal program, and checks, before a start of transfer of the renewal program from the communication controller to the vehicle controller, whether the charge amount detected by the charge amount detector is equal to or greater than a transfer charge amount preliminarily set as a charge amount required to transfer the renewal program from the communication controller to the vehicle controller, and when the charge amount detected by the charge amount detector is equal to or greater than the transfer charge amount, permits the transfer request section to request the transfer and causes the storage section to store the transferred renewal program;

the rewrite charge amount is set to be equal to or greater than a charge amount required to rewrite the currently used program by the rewrite section; and the vehicle controller checks, before performing the rewriting process and after the renewal program is transferred from the communication controller to the vehicle controller, whether the charge amount detected by the charge amount detector is smaller than the rewrite charge amount, and when the charge amount detected by the charge amount detector is smaller than the rewrite charge amount, prohibits the rewrite section from rewriting the currently used program.

2. The construction machine according to claim 1, wherein the rewrite charge amount is set to be equal to or greater than a sum of a charge amount required to transfer the renewal program from the communication controller to the vehicle controller and a charge amount required to rewrite the currently used program by the rewrite section; and the communication controller prohibits the transfer request section from requesting the transfer when the charge amount detected by the charge amount detector is smaller than the rewrite charge amount.

3. The construction machine according to claim 1, wherein:

the vehicle controller checks, during the transfer of the renewal program from the communication controller to the vehicle controller, whether the charge amount detected by the charge amount detector is smaller than a non-transferred charge amount preliminarily set as a charge amount required to transfer a non-transferred portion of the renewal program, and when the charge amount detected by the charge amount detector is smaller than the non-transferred charge amount, compulsorily terminates the transfer of the renewal program.

4. A program-rewritable system, comprising:

the construction machine according to claim 1; and a server configured to contain a renewal program and configured to be connected to the controller of the construction machine via a communication means, wherein the construction machine includes a vehicle controller for storing the currently used program, and a communication controller communicable with the server via a communication means to store the renewal program transferred from the server, and the vehicle controller includes a transfer request section for requesting the communication controller to transfer the renewal program, and a rewrite section for performing the rewriting process using the renewal program transferred from the communication controller.

* * * * *